United States Patent
Furesawa

(10) Patent No.: US 11,798,964 B2
(45) Date of Patent: Oct. 24, 2023

(54) IMAGING APPARATUS AND CAMERA FOR REDUCING OF INFLUENCE OF VIBRATION ON AN IMAGE SIGNAL SUBJECT TO PHOTOELECTRONIC CONVERSION

(71) Applicant: CANON KABUSHIKI KAISHA, Tokyo (JP)

(72) Inventor: Ayako Furesawa, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/063,859

(22) Filed: Oct. 6, 2020

(65) Prior Publication Data
US 2021/0111208 A1    Apr. 15, 2021

(30) Foreign Application Priority Data
Oct. 11, 2019    (JP) .................................. 2019-187965

(51) Int. Cl.
*H01L 27/146* (2006.01)
*H01L 23/00* (2006.01)
(Continued)

(52) U.S. Cl.
CPC ........ *H01L 27/14618* (2013.01); *H01L 24/32* (2013.01); *H01L 24/48* (2013.01);
(Continued)

(58) Field of Classification Search
CPC ..... H01L 21/78; H01L 25/50; H01L 25/0655; H01L 21/31053; H01L 21/4853; H01L 23/522; H01L 25/16; H01L 24/97; H01L 21/6835; H01L 24/19; H01L 21/50; H01L 24/96; H01L 23/3107; H01L 21/565;
(Continued)

(56) References Cited

U.S. PATENT DOCUMENTS

| 5,751,059 A | 5/1998 | Prost |
| 6,175,114 B1 | 1/2001 | Hori |

(Continued)

FOREIGN PATENT DOCUMENTS

| JP | 2000-294759 A | 10/2000 |
| JP | 2004-327559 A | 11/2004 |

(Continued)

*Primary Examiner* — Gevell V Selby
(74) *Attorney, Agent, or Firm* — CANON U.S.A., INC. IP Division

(57) ABSTRACT

In an apparatus, effective pixels of C×A-number composed of pixel rows of A-number and pixel columns of C-number or composed of the pixel rows of the C-number and the pixel columns of the A-number are arrayed in an effective pixel area of a chip, and images of a number not more than B-number are output from the chip for one second, wherein A, B and C are positive integers. The adhesive includes first, second, third, and fourth portions placed between a base body and the chip. The first and second portions are positioned between the third and fourth portions in the array direction of the pixel rows or columns. A gap is provided between the first and second portions, between the second and third portions, and between the first and fourth portions. The first and second portions are positioned between the effective pixel area and the base body.

25 Claims, 9 Drawing Sheets

(51) Int. Cl.
*H04N 23/68* (2023.01)
*G02B 7/04* (2021.01)
*G03B 13/32* (2021.01)
*G02B 27/64* (2006.01)
*G03B 5/00* (2021.01)

(52) U.S. Cl.
CPC ........ *H01L 24/73* (2013.01); *H01L 27/14623* (2013.01); *H01L 27/14627* (2013.01); *H04N 23/685* (2023.01); *G02B 7/04* (2013.01); *G02B 27/646* (2013.01); *G03B 5/00* (2013.01); *G03B 13/32* (2013.01); *G03B 2205/0007* (2013.01); *H01L 2224/32225* (2013.01); *H01L 2224/48225* (2013.01); *H01L 2224/73265* (2013.01)

(58) Field of Classification Search
CPC ..... H01L 23/64; H01L 23/5389; H01L 21/56; H01L 24/48; H01L 24/16; H01L 2924/3025; H01L 2924/19105; H01L 2924/01006; H01L 2924/01029; H01L 2924/014; H01L 2224/97; H01L 2924/14; H01L 2224/96; H01L 2924/15174; H01L 2224/19; H01L 2224/48091; H01L 2924/181; H01L 2924/00014; H01L 2224/04105; H01L 2924/01078; H01L 2221/68345; H01L 2224/16225; H01L 2924/19041; H01L 2924/01005; H01L 2224/48227; H01L 2924/01033; H01L 21/568; H01L 2924/00; H01L 2924/00012; H01L 2224/45099; H01L 2224/45015; H01L 2924/207
See application file for complete search history.

(56) References Cited

U.S. PATENT DOCUMENTS

| | | | |
|---|---|---|---|
| 6,352,875 | B1 | 3/2002 | Hayashi |
| 2006/0231961 | A1 | 10/2006 | Shibayama |
| 2010/0110282 | A1* | 5/2010 | Lan ...................... H04N 5/2257 348/374 |
| 2011/0147707 | A1 | 6/2011 | Inada |
| 2018/0220073 | A1* | 8/2018 | Keal .................. H04N 5/23258 |
| 2019/0137724 | A1* | 5/2019 | Kim ..................... H04N 5/2253 |
| 2019/0172863 | A1* | 6/2019 | Masuda ................ H04N 5/369 |
| 2020/0183450 | A1* | 6/2020 | Jang ....................... G06F 1/1652 |
| 2021/0265404 | A1* | 8/2021 | Sasaki ............... H01L 27/14627 |

FOREIGN PATENT DOCUMENTS

| | | |
|---|---|---|
| JP | 2005-012334 A | 1/2005 |
| JP | 2007-285709 A | 11/2007 |
| JP | 2013-143416 A | 7/2013 |
| JP | 2016-39491 A | 3/2016 |
| JP | 2017-011217 A | 1/2017 |

* cited by examiner

FIG. 6A

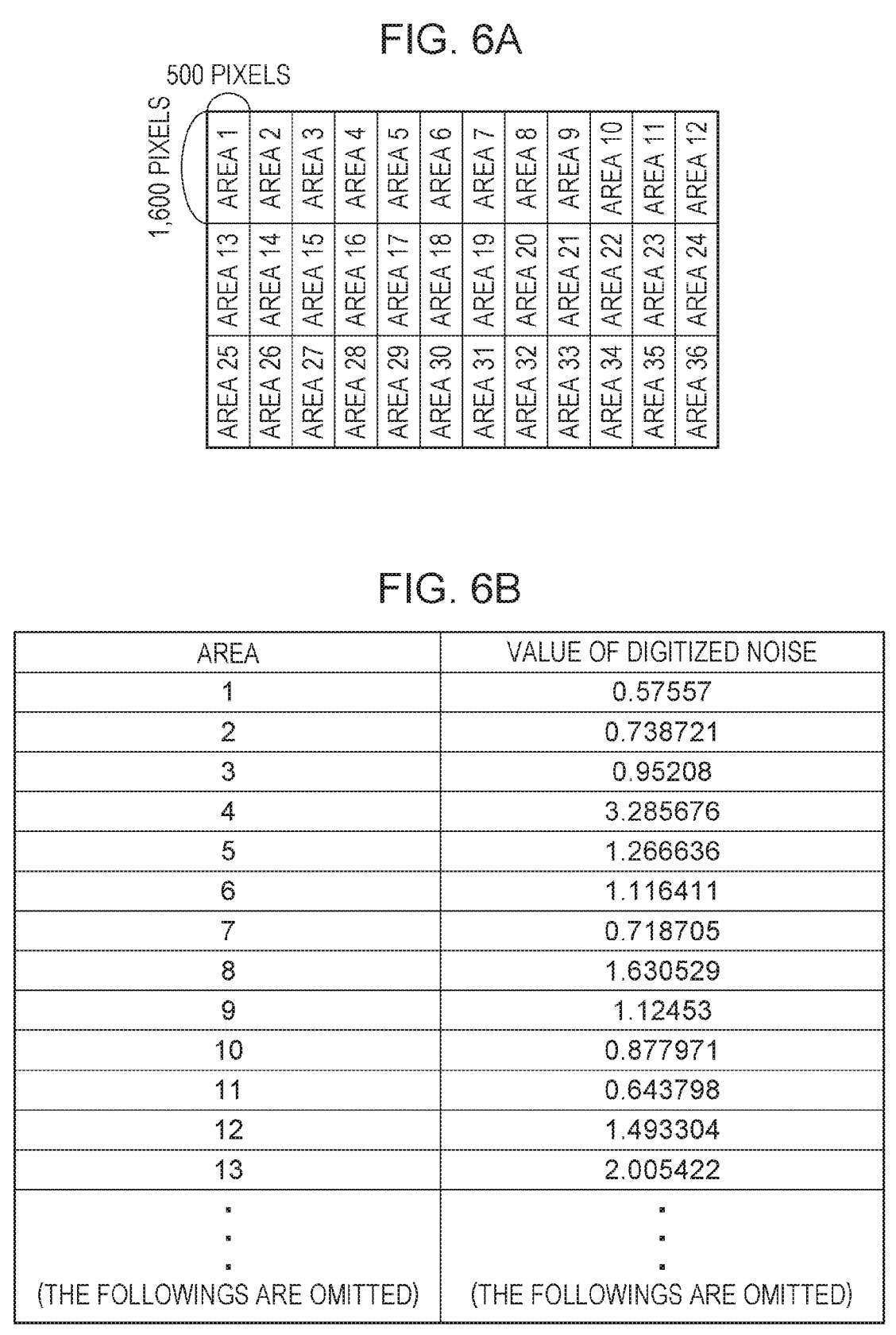

500 PIXELS
1,600 PIXELS

| AREA 1 | AREA 2 | AREA 3 | AREA 4 | AREA 5 | AREA 6 | AREA 7 | AREA 8 | AREA 9 | AREA 10 | AREA 11 | AREA 12 |
| AREA 13 | AREA 14 | AREA 15 | AREA 16 | AREA 17 | AREA 18 | AREA 19 | AREA 20 | AREA 21 | AREA 22 | AREA 23 | AREA 24 |
| AREA 25 | AREA 26 | AREA 27 | AREA 28 | AREA 29 | AREA 30 | AREA 31 | AREA 32 | AREA 33 | AREA 34 | AREA 35 | AREA 36 |

FIG. 6B

| AREA | VALUE OF DIGITIZED NOISE |
|---|---|
| 1 | 0.57557 |
| 2 | 0.738721 |
| 3 | 0.95208 |
| 4 | 3.285676 |
| 5 | 1.266636 |
| 6 | 1.116411 |
| 7 | 0.718705 |
| 8 | 1.630529 |
| 9 | 1.12453 |
| 10 | 0.877971 |
| 11 | 0.643798 |
| 12 | 1.493304 |
| 13 | 2.005422 |
| ⋮ (THE FOLLOWINGS ARE OMITTED) | ⋮ (THE FOLLOWINGS ARE OMITTED) |

# IMAGING APPARATUS AND CAMERA FOR REDUCING OF INFLUENCE OF VIBRATION ON AN IMAGE SIGNAL SUBJECT TO PHOTOELECTRONIC CONVERSION

BACKGROUND OF THE DISCLOSURE

Field of the Disclosure

The technology relates to an imaging apparatus and a camera.

Description of the Related Art

In photographing with a camera typified by a digital still camera, vibration involved in an operation of a mechanical apparatus (for example, an operation of a focal plane shutter) may occur while an image signal that is subjected to photoelectric conversion in a pixel in an imaging chip is being read out after exposure in the chip is finished. This vibration creates a problem in that noise occurs in a solid-state imaging element and is superimposed on the image signal that is output.

Japanese Patent Laid-Open No. 2016-39491 discloses a technology to provide an imaging apparatus capable of outputting a good image signal by inhibiting noise caused by vibration from being superimposed on an image signal that is output. Specifically, the imaging apparatus is controlled so that the readout of the image signals from the pixels is stopped when the operation of a movable member causes the vibration to inhibit the superimposition of the noise caused by the vibration on the image signal.

With the technology disclosed in Japanese Patent Laid-Open No. 2016-39491, it is not possible to read out the image signal while the movable member is performing an operation to cause the vibration and a limitation is imposed on a frame rate (the number of images that are read out for one second).

SUMMARY OF THE DISCLOSURE

An apparatus according to an embodiment of the present disclosure includes a base body; a chip that is placed on the base body and that is mainly made of silicon; and adhesive which is placed between the base body and the chip and with which the base body is bonded to the chip. Effective pixels of C×A-number composed of pixel rows of A-number and pixel columns of C-number or composed of the pixel rows of the C-number and the pixel columns of the A-number are arrayed in an effective pixel area of the chip, and images of a number not more than B-number, each of which is composed of the pixels of the C×A-number, are acquired from the chip for one second, wherein A, B and C are positive integers. The adhesive includes a first portion, a second portion, a third portion, and a fourth portion, which are placed between the base body and the chip. The first portion and the second portion are positioned between the third portion and the fourth portion in a direction in which the pixel rows or the pixel columns are arrayed. A gap is provided between the first portion and the second portion, between the second portion and the third portion, and between the first portion and the fourth portion. The first portion and the second portion are positioned between the effective pixel area and the base body. A first spacing of the adhesive between the first portion and the second portion is greater than a distance between the base body and the chip via the gap between the first portion and the second portion.

Further features of the disclosure will become apparent from the following description of exemplary embodiments with reference to the attached drawings.

BRIEF DESCRIPTION OF THE DRAWINGS

FIG. 6A and FIG. 6B are schematic diagrams for describing evaluation of the imaging apparatus according to the embodiment of the present disclosure.

DESCRIPTION OF THE EMBODIMENTS

Figure 1A:
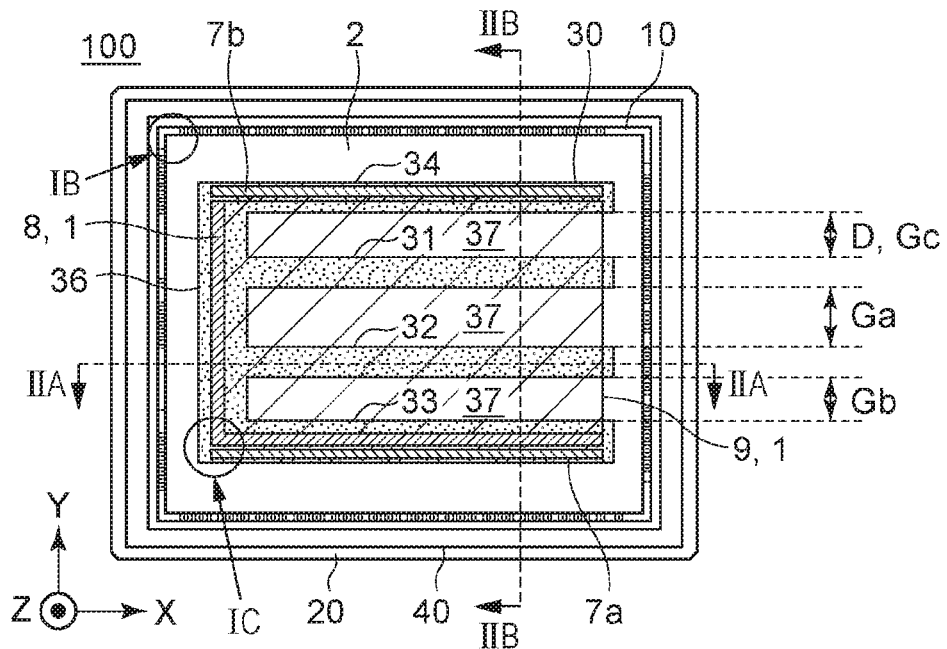
FIG. 1A to FIG. 1C are schematic plan views for describing an imaging apparatus according to an embodiment of the present disclosure.

Embodiments of the present disclosure will herein be described with reference to the drawings. Common reference numerals are added to components common to multiple drawings in the following description and the drawings. Accordingly, the common components will be described with mutual reference to the multiple drawings and a description of the components to which the common reference numerals are added is appropriately omitted herein.

The present disclosure aims to provide a technology advantageous to reduction of the influence of vibration on an image signal subjected to photoelectric conversion.

An example of an imaging apparatus 100 according to an embodiment of the present disclosure will now be described.

Figure 1B:
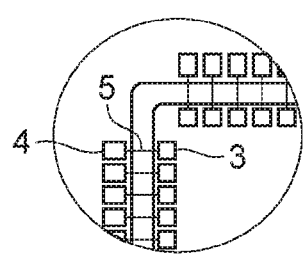
Figure 1C:
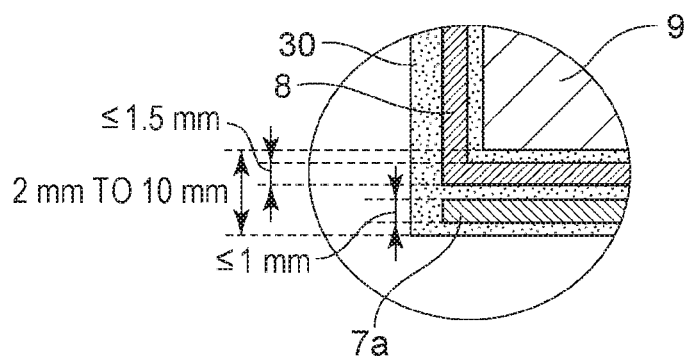

FIG. 1A to FIG. 1C are schematic plan views when the imaging apparatus 100 of the present embodiment is viewed from the front. FIG. 1B is an enlarged view of an IB portion in FIG. 1A. FIG. 1C is an enlarged view of an IC portion in FIG. 1A.

Figure 2A:
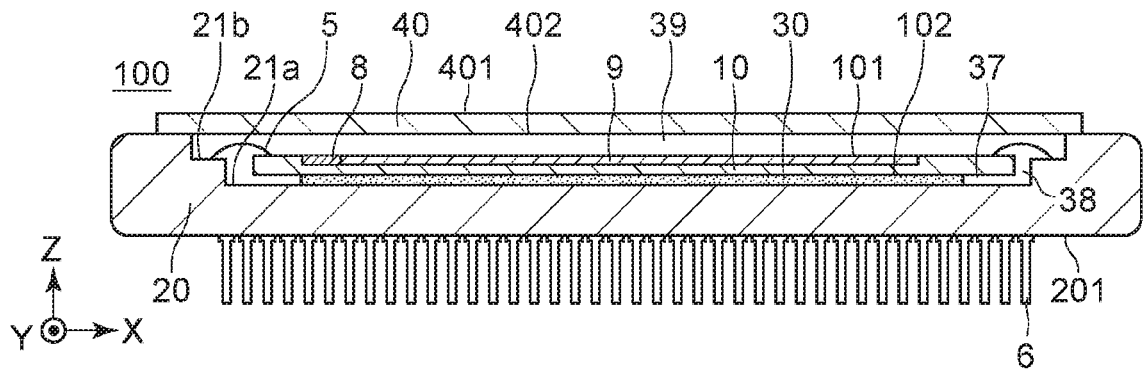
FIG. 2A to FIG. 2C are schematic cross-sectional views for describing the imaging apparatus according to the embodiment of the present disclosure.
Figure 2B:
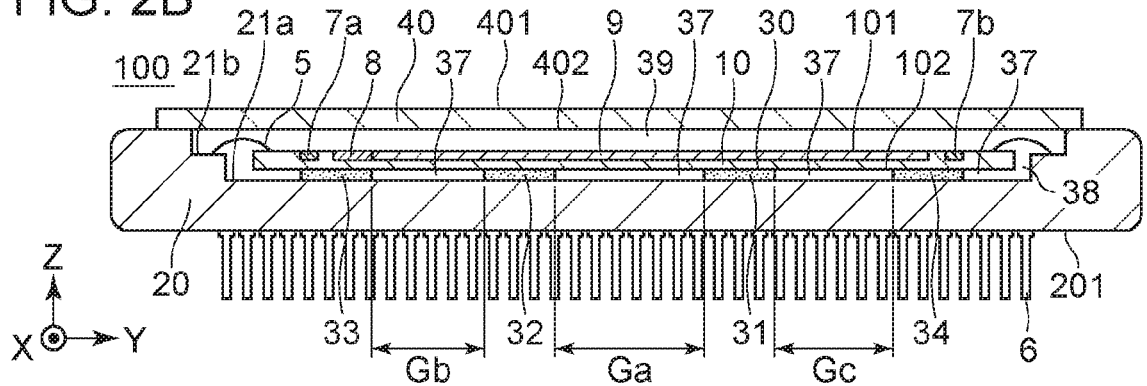
Figure 2C:
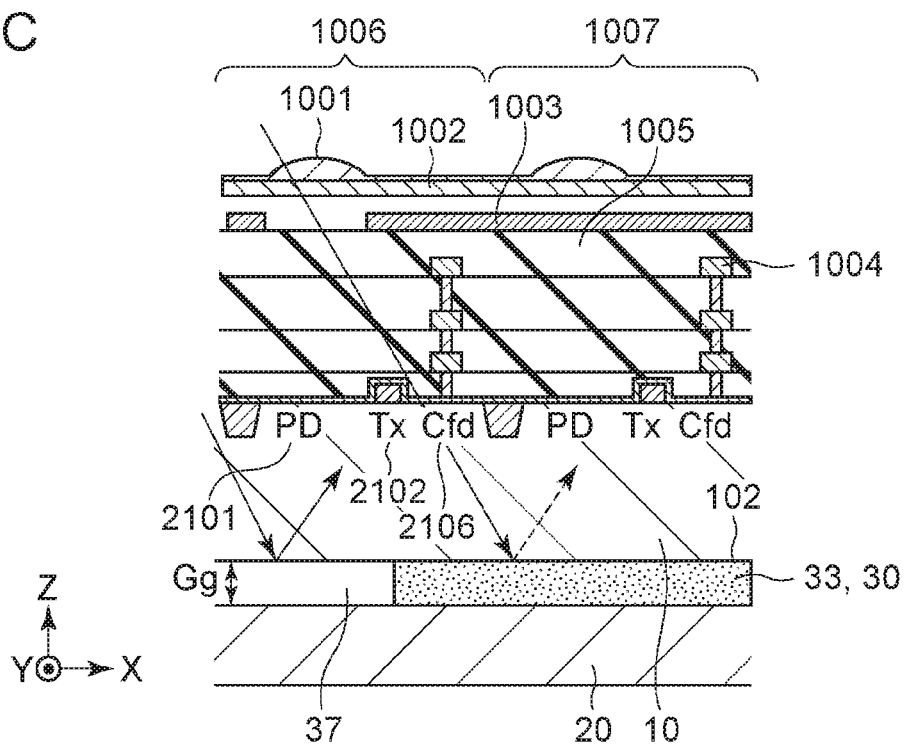

FIG. 2A to FIG. 2C are schematic cross-sectional views of the imaging apparatus 100 of the present embodiment. FIG. 2A is a cross-sectional view of the imaging apparatus 100 of the present embodiment taken along an IIA-IIA line in FIG. 1A. FIG. 2B is a cross-sectional view of the imaging apparatus 100 of the present embodiment taken along an IIB-IIB line in FIG. 1A. The X direction, the Y direction, and the Z direction are illustrated in FIG. 1A and FIG. 2A to FIG. 2C.

The imaging apparatus 100 is composed of an imaging chip 10 (hereinafter referred to as a chip 10) mainly made of silicon, a base body 20 to which the chip 10 is bonded, adhesive 30 with which the chip 10 is bonded to the base body 20, and a light transmitting member 40.

The positional relationship between the members composing the imaging apparatus 100 is capable of being described based on an XY plane. The direction orthogonal to the XY plane is the Z direction. A front face 101 of the chip 10 and a rear face 102 of the chip 10 are parallel to the XY plane. As a typical example, an outer surface 401 of the light transmitting member 40 and an inner surface 402 of the light transmitting member 40 are parallel to the XY plane. The front face 101 is opposed to the inner surface 402, the rear face 102 is opposed to the base body 20, and the rear face 102 is bonded to the base body 20.

Two-stage recesses 21a and 21b are provided in the base body 20 to which the chip 10 is bonded. The chip 10 is arranged in at least part of a central region in the lower recess 21a to be bonded to the base body 20. The chip 10 is typically bonded to the base body 20 with the adhesive 30 interposed therebetween, as illustrated in FIG. 1A to FIG. 1C and FIG. 2A to FIG. 2B. The adhesive 30 is placed between the area where the base body 20 is arranged and the rear face 102 of the chip 10. The adhesive 30 may be conductive or may be insulative. The adhesive 30 can have a high thermal conductivity and the adhesive 30 containing metal particles may be used.

There is a difference between the coefficient of linear expansion (about 3 ppm/° C.) of the chip 10 mainly made of silicon and the coefficient of linear expansion (about 7 ppm/° C. in the case of ceramics) of the base body 20 in the present embodiment. Accordingly, a material having rubber elasticity can be selected as the adhesive 30 to suppress warpage of the chip 10. Specifically, the adhesive 30 made of silicone resin can be used, which has an elasticity modulus of 1 MPa to 100 MPa. In particular, the adhesive 30 made of such a material is effective when the chip 10 has a large planar size in the XY direction and is highly effective for the chip 10 having a size of APS-C or more.

The base body 20 is sealed with the light transmitting member 40 in order to protect the chip 10 from deterioration caused by mechanical shock, oxygen, or the like. The chip 10 is fixed in the lower recess 21a of the base body 20 and the base body 20 is sealed with the light transmitting member 40 to cause the light transmitting member 40 to be opposed to the chip 10 with inner space 39 interposed therebetween, as illustrated in FIG. 2A and FIG. 2B. Space 38 facing side faces of the chip 10 communicates with the inner space 39.

As illustrated in FIG. 1A, the chip 10 has a pixel portion 1 and a peripheral portion 2. The pixel portion 1 is positioned in a central region of the chip 10 and the peripheral portion 2 is positioned on the periphery of the pixel portion 1. The chip 10 is exemplified by, for example, a charge coupled device (CCD) image sensor or a complementary metal oxide semiconductor (CMOS) image sensor although the chip 10 is not limited to such an image sensor. The pixel portion 1 is composed of pixels each including a photoelectric conversion element that generates an image signal subjected the photoelectric conversion after exposure in the chip 10 is finished. The front face 101 of the chip 10, which is opposed to the light transmitting member 40, is a light incident face. This light incident face may be composed of a surface layer of a multilayer film provided on a semiconductor substrate having a light receiving surface.

Multiple pixels are arrayed over pixel rows and pixel columns in the pixel portion 1 of the chip 10. The pixels are arranged in the X direction (row direction) on one pixel row. The pixels are arranged in the Y direction (column direction) on one pixel column. Multiple pixel columns are arranged in the X direction and multiple pixel rows are arranged in the Y direction. Accordingly, the multiple pixel columns are arranged in the row direction and the multiple pixel rows are arranged in the column direction.

FIG. 2C is a schematic cross-sectional view in the pixel portion 1 of the chip 10 of the present embodiment. The multilayer film includes a microlens layer 1001, a color filter layer 1002, and a light shielding layer 1003, which have optical functions. The multilayer film also includes a metal wiring layer 1004, an interlayer insulating film layer 1005, and so on.

As illustrated in the enlarged detail view of the IC portion in FIG. 1C, an effective pixel area 9 and a light shielded pixel area 8 are provided for the pixels composing the pixel portion 1 of the chip 10. The effective pixel area 9 is composed of effective pixels 1006 for composing an image. The light shielded pixel area 8 is composed of light shielded pixels 1007 that are shielded by the light shielding layer 1003 illustrated in FIG. 2C to define reference voltage in dark time. In addition, as illustrated in FIG. 1A and the enlarged detail view of the IC portion in FIG. 1C, the light shielded pixel area 8 is provided in the X direction (the row direction) and the Y direction (the column direction) outside the effective pixel area 9. The light shielded pixel area 8 provided in the X direction (the row direction) is adjacent to the light shielded pixel area 8 provided in the Y direction (the column direction). The light shielded pixel area 8 may include a first light shielded pixel area adjacent to the effective pixel area 9 in the Y direction and a second light shielded pixel area adjacent to the effective pixel area 9 in the X direction. The light shielded pixels in the first light shielded pixel area are included in the pixel columns including the multiple effective pixels arranged in the Y direction in the effective pixel area 9. The second light shielded pixel area includes the light shielded pixels included in the pixel rows including the multiple effective pixels arranged in the X direction in the effective pixel area 9.

It is assumed here that the pixel row in the effective pixel area 9 in the chip 10 includes pixels of C-number and the pixel column in the effective pixel area 9 in the chip 10 includes pixels of A-number. The pixel columns of the C-number exist in the effective pixel area 9 in the chip 10 and the pixel rows of the A-number exist in the effective pixel area 9 in the chip 10. Pixels of C×A-number exist in the effective pixel area 9. A specific value of the C×A-number is typically described as the number of effective pixels in a catalog, an instruction manual, and the specifications of the camera in which the imaging apparatus is installed. Although the example is described here in which the pixels of the C×A-number are composed of the pixel columns of the C-number and the pixel rows of the A-number, the pixels of the C×A-number may be composed of the pixel columns of the A-number and the pixel rows of the C-number. In other words, it is sufficient for the effective pixels of the C×A-number composed of the pixel rows of the A-number and the pixel columns of the C-number or composed of the pixel rows of the C-number and the pixel columns of the A-number to be arrayed in the effective pixel area 9. Although the pixel signals of the effective pixels of the C×A-number are read out for every pixel row in the present embodiment, the pixel signals of the effective pixels of the C×A-number may be read out for every pixel column. Typically, A<C for the pixel rows of the A-number and the pixel columns of the C-number. For example, 1<C/A<2 or 1.3<C/A<1.8. The number of images composed of the pixels of the C×A-number is typically described as, for example, the number of recorded pixels of a large(L)-size image in a catalog, an instruction manual, and the specifications of the camera in which the imaging apparatus is installed. A typical value of the C×A-number is any value from one million to one billion and, for example, any value from ten million to one hundred million. A typical value of the A-number is any number from one thousand to thirty thousand and, for example, two thousand to ten thousand. For example, C×A is 5,400×3,600=19, 440,000 (about 20 mega pixels). In this case, C/A=1.5.

The maximum number of images each of which is composed of the pixels of the C×A-number and which are capable of being acquired from the chip 10 for one second is defined as B. In other words, it is possible to acquire the images of a number not more than the B-number, each of which is composed of the pixels of the C×A-number, from the chip 10 for one second. When each of the images of the B-number is composed of the pixels of the C×A-number, B≥2. It is not possible to acquire the images of a number not more than B+1 number, each of which is composed of the pixels of the C×A-number, from the chip 10 for one second. A specific value of the B number is typically described as a continuous shooting speed in a catalog, an instruction manual, and the specifications of the camera in which the imaging apparatus is installed. The continuous shooting speed is represented by, for example, B frames/second. For example, when the maximum number of images each of which is composed the 19,440,000 pixels described above and which are capable of being captured every second is 20, A=3,600 and B=20. The shooting mode when the images of the B-number are output may be a still-image shooting mode or a moving-image shooting mode. In one embodiment, each of all the images of the B-number, which is the maximum number, is to be composed of the pixels of the C×A-number. For example, since a crop image resulting from selective output of part of the pixels of the C×A-number in the effective pixel area 9 is not the image composed of the pixels of the C×A-number, the crop image is not counted as the images of the B-number. In other words, even when the imaging apparatus is capable of outputting for one second the images of a number exceeding the B-number, each of which is composed of the pixels of a number smaller than the C×A-number, it is not appropriate to apply the A-number and the B-number to such a case in the following consideration. For example, when the imaging apparatus is considered, which is capable of outputting 240 images per second only using 1,920×1,080 pixels, among 5,400×3,600 pixels, the consideration using A=1,080 and B=240 is not appropriate.

FIG. 1A illustrates the positional relationship between the adhesive 30 and the chip 10 (the pixel portion 1) in the X direction and the Y direction. FIG. 2A to FIG. 2C illustrate the positional relationship between the adhesive 30 and the chip 10 (the pixel portion 1) in the Z direction. Referring to FIG. 1A, overlapping of the adhesive 30 with the effective pixel area 9 is represented by overlapping the hatching of the adhesive 30 with the hatching of the effective pixel area 9. The adhesive 30 may be overlapped with the light shielded pixel area 8 and the adhesive 30 may be overlapped with current sources 7, as described below. However, the hatching of the adhesive 30 is not overlapped with the hatching of the light shielded pixel area 8 or the current sources 7 in order to ensure the visibility of the drawing.

The adhesive 30 includes a first portion 31, a second portion 32, a third portion 33, and a fourth portion 34, which are placed between the base body 20 and the chip 10. The first portion 31 and the second portion 32 are positioned between the third portion 33 and the fourth portion 34 in the direction in which the pixel rows are arranged (the Y direction). A gap 37 is provided between the first portion 31 and the second portion 32, between the second portion 32 and the third portion 33, and between the first portion 31 and the fourth portion 34. As illustrated in FIG. 2C, the gap 37 is placed between the base body 20 and the chip 10.

A distance between the base body 20 and the chip 10 via the gap 37 between the first portion 31 and the second portion 32 is denoted by Gg. The distance Gg is substantially equal to the thickness of the adhesive 30. The first portion 31 and the second portion 32 are positioned between the effective pixel area 9 and the base body 20. A spacing of the adhesive 30 between the first portion 31 and the second portion 32 is denoted by Ga. The spacing Ga is greater than the distance Gg. A typical lower limit of the range of the distance Gg is 1 μm, 5 μm, or 10 μm. A typical upper limit of the range of the distance Gg is 1,000 μm, 100 μm, 50 μm, or 30 μm. A typical lower limit of the spacing Ga is 1 μm, 10 μm, 100 μm, or 1,000 μm. A typical upper limit of the spacing Ga is 100 μm, 1,000 μm, 10 mm, or 50 mm. For example, the distance Gg is 1 μm to 5,100 μm and the spacing Ga is 100 μm to 10 mm. It is assumed in the following description that the spacing Ga (Gb, Gc, and so on) between the multiple portions of the adhesive 30 via the gap 37 is greater than the distance Gg regardless of the spacing of the adhesive 30 between the first portion 31 and the second portion 32.

Dividing the adhesive 30 into at least quarters in the Y direction and arranging the two inner portions (the first portion 31 and the second portion 32) between the effective pixel area 9 and the base body 20 enable the effective pixel area 9 to be fixed to the base body 20 to effectively suppress local deformation of the chip 10 in the effective pixel area 9. This reduces the influence of the vibration on the image signal subjected to the photoelectric conversion. Arranging the adhesive 30 between the entire rear face 102 of the chip 10 and the base body 20 or arranging the adhesive 30 between the entire effective pixel area 9 and the base body 20 also reduces the influence of the vibration. However, since the area of the fixed area between the chip 10 and the base body 20 is increased in this case, the stress between the chip 10 and the base body 20 is increased to possibly cause the influence based on the stress. Providing the gap 37, the first portion 31, and the second portion 32 between the effective pixel area 9 and the base body 20 in the manner of the present embodiment enables both the influence of the vibration and the influence of the stress to be reduced. In addition, since the provision of the gap 37 reduces the usage of the adhesive 30, the provision of the gap 37 is also advantageous to reduction of the cost.

A spacing of the adhesive 30 between the second portion 32 and the third portion 33 is denoted by Gb. A spacing of the adhesive 30 between the first portion 31 and the fourth portion 34 is denoted by Gc. A distance between the first portion 31 and the fourth portion 34 is denoted by D. Although D=Gc may be established because no portion of the adhesive 30 exists between the first portion 31 and the fourth portion 34 in the present embodiment, D>Gc may be established if a portion of the adhesive 30 exists between the first portion 31 and the fourth portion 34. The fourth portion 34 is positioned at the opposite side of the second portion 32 and the third portion 33 with respect to the first portion 31. The fourth portion 34 is not apart from the first portion 31, compared with the third portion 33, and D≤Ga+Gc may be established. The width of the first portion 31 in the Y direction and the width of the second portion 32 in the Y direction can be smaller than the spacing Ga. The width of the second portion 32 in the Y direction and the width of the third portion 33 in the Y direction can be smaller than the spacing Gb. The width of the first portion 31 in the Y direction and the width of the fourth portion 34 in the Y direction can be smaller than the spacing Gc.

The third portion 33 may be positioned between the effective pixel area 9 and the base body 20. In particular, the third portion 33 may be positioned between the pixel row at the bottom (a certain pixel row) of the effective pixel area 9 and the base body 20. The fourth portion 34 may be positioned between the pixel row at the top (another pixel row) of the effective pixel area 9 and the base body 20. Since the pixel rows of the A-number are provided in the effective pixel area 9, the pixel rows of A-2-number are placed between the pixel row at the bottom (the certain pixel row) and the pixel row at the top (the other pixel row).

At least part of the third portion 33 is positioned between the light shielded pixel area 8 (the first light shielded pixel area) and the base body 20. The adhesive 30 extends along the Y direction and may include a sixth portion 36 having a length exceeding Ga+Gb+Gc in the Y direction. At least part of the sixth portion 36 is positioned between the light shielded pixel area 8 (the second light shielded pixel area) and the base body 20. The adhesive 30 may be positioned between all the light shielded pixels of the chip 10 and the base body 20. Although the L-shaped light shielded pixel area is provided so as to be adjacent to two sides that are adjacent to each other in the rectangular effective pixel area 9 in the present embodiment, the provision of the light shielded pixel area is not limited to this. For example, the light shielded pixel area may be provided so as to be adjacent to two sides that are opposed to each other in the rectangular effective pixel area 9. Alternatively, the light shielded pixel area may be provided so as to be adjacent to three sides in the rectangular effective pixel area 9 or the light shielded pixel area may be provided so as to be adjacent to the four sides in the rectangular effective pixel area 9. As illustrated in FIG. 1A, although the adhesive 30 includes the sixth portion 36 extending along the left side of the effective pixel area 9, the adhesive 30 includes no portion extending along the right side of the effective pixel area 9. Accordingly, the gap 37 communicates with the space 38 facing side faces of the chip 10. Not making the gap 37 between the chip 10 and the base body 20 closed space owing to the adhesive 30 in the above manner enables the deformation of the chip 10 caused by expansion of gas existing in the gap 37 to be suppressed.

A driving circuit for driving the pixel portion 1, a circuit that reads out the image signal from the pixel portion 1, and a signal processing circuit that processes a signal to the pixel portion 1 are provided in the peripheral portion 2 of the chip 10. As illustrated in the enlarged detail view of the IB portion in FIG. 1B, electrodes 3 (electrode pads) for communication of a signal between the chip 10 and the outside are provided in the peripheral portion 2.

The chip 10 includes multiple current sources each corresponding to any of all the pixel columns. The multiple current sources are included in the peripheral portion 2. The adhesive 30 can be positioned between all the multiple current sources and the base body 20. In the present embodiment, the current sources include a first current source group 7a and a second current source group 7b. The effective pixel area 9 is positioned between the first current source group 7a and the second current source group 7b. Part of the third portion 33 of the adhesive 30 is positioned between the first current source group 7a and the base body 20. Part of the fourth portion 34 of the adhesive 30 is positioned between the second current source group 7b and the base body 20.

Although it is sufficient for the third portion 33 to be positioned between the base body 20 and at least one of the effective pixel area 9, the light shielded pixel area 8, and the current sources 7, the third portion 33 can be positioned between the base body 20 and all the effective pixel area 9, the light shielded pixel area 8, and the current sources. To this end, it is effective to make the width of the third portion 33 in the Y direction greater than the widths of the other portions (the first portion 31, the second portion 32, and the fourth portion 34) of the adhesive 30 in the Y direction.

Although the adhesive 30 is divided into quarters in the Y direction between the effective pixel area 9 and the base body 20 here, it is sufficient to realize N-division (N 4). For example, the adhesive 30 may be divided into fifths to further arrange a portion of the adhesive 30, which is positioned between the effective pixel area 9 and the base body 20, between the first portion 31 and the fourth portion 34. Although the adhesive 30 is divided into quarters in the Y direction between the chip 10 and the base body 20 here, it is sufficient to realize M-division (M 4). For example, the adhesive 30 may be divided into sixths to arrange a portion of the adhesive 30 at the opposite side of the second portion 32 with respect to the third portion 33 (at the lower side of the third portion 33) and a portion of the adhesive 30 at the opposite side of the first portion 31 with respect to the fourth portion 34 (at the upper side of the fourth portion 34). The peripheral portion 2 is bonded to the base body 20 with the above portions of the adhesive 30.

As illustrated in the enlarged detail view of the IB portion in FIG. 1B and FIG. 2A to FIG. 2B, the base body 20 has internal terminals 4 formed on the periphery of the lower recess 21a on an inner bottom face of the upper recess 21b of the base body 20 and external terminals 6 formed on an outer face 201 of the base body 20. The multiple internal terminals 4 compose an internal terminal group.

In the present embodiment, as illustrated in the enlarged detail view of the IB portion in FIG. 1B, the internal terminal group composed of the multiple internal terminals 4 arranged in a line in the X direction and in a line in the Y direction is arranged so as to surround the chip 10. The arrangement of the internal terminals 4 is not limited to this and the internal terminal group arranged in a line only in the X direction or the Y direction may be placed.

The electrodes 3 of the chip 10 are electrically connected to the internal terminals 4 of the base body 20 with a connection conductor 5. Accordingly, the image signal subjected the photoelectric conversion in the pixel in the chip 10 after the exposure in the chip 10 is finished sequentially passes through the electrodes 3, the connection conductor 5, and the internal terminals 4 and is supplied to the external terminals 6 via internal wiring (not illustrated) in the base body 20. The connection conductor 5 is formed of a metallic line. A gold line, an aluminum line, a copper line, or the like is mainly used as the metallic line. The connection is typically achieved through ultrasonic thermal compression bonding using known wire bonder.

The configuration of the chip 10 will now be described with reference to FIGS. 3A and 3B and FIGS. 4A and 4B. FIG. 3A illustrates an example of the configuration of a pixel 2001 in the chip 10. FIG. 4A and FIG. 4B illustrate examples of the configuration of a peripheral circuit of the chip 10. The pixels 2001 of two rows×two columns, a signal output line 2002 for reading out the pixel signal, and an image-signal readout circuit corresponding to the peripheral portion 2 of the chip 10 are illustrated in FIG. 4A and FIG. 4B for convenience of description.

Each pixel 2001 includes a photo diode (PD) 2101, a transfer transistor (tx) 2102, a reset transistor (tres) 2103, an amplifier transistor (tsf) 2104, and a selection transistor (tsel) 2106, as illustrated in FIG. 3A. For example, a metal oxide semiconductor (MOS) transistor is used as each of the transfer transistor 2102, the reset transistor 2103, the amplifier transistor 2104, and the selection transistor 2105.

The photo diode 2101 generating the electric charge of an optical signal is grounded at the anode side. The cathode side of the photo diode 2101 is connected to a floating diffusion (Cfd) 2106 and the gate of the amplifier transistor 2104 via the transfer transistor 2102. The source of the reset transistor 2103 for resetting the floating diffusion 2106 is connected to the floating diffusion 2106 and the gate of the amplifier transistor 2104. The drain of the reset transistor 2103 is connected to power supply voltage VDD. The drain of the amplifier transistor 2104 is connected to the power supply voltage VDD and the source of the amplifier transistor 2104 is connected to the drain of the selection transistor 2105.

A signal ptx is supplied to the gate terminal of the transfer transistor 2102 and the transfer transistor 2102 transfers a signal from the photo diode 2101 to the floating diffusion 2106 and the gate of the amplifier transistor 2104. A signal pres is supplied to the gate terminal of the reset transistor 2103 and the reset transistor 2103 resets the floating diffusion 2106 and the photo diode 2101. A signal psel is supplied to the gate terminal of the selection transistor 2105 and the selection transistor 2105 outputs the signal from a terminal out.

Figure 3B:
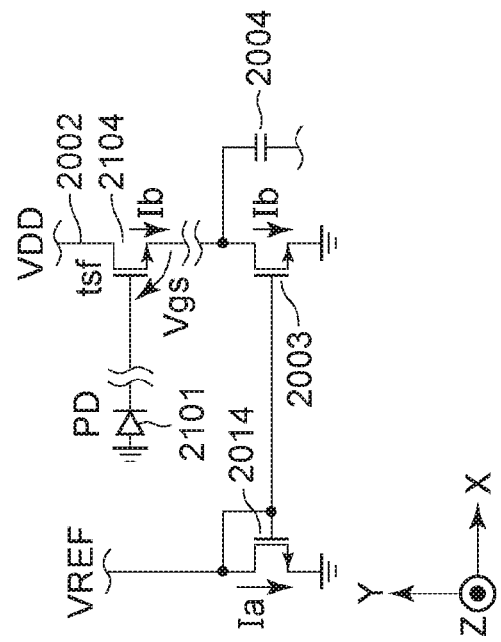
FIG. 3A and FIG. 3B are schematic diagrams for describing the imaging apparatus according to the embodiment of the present disclosure.
Figure 3A:
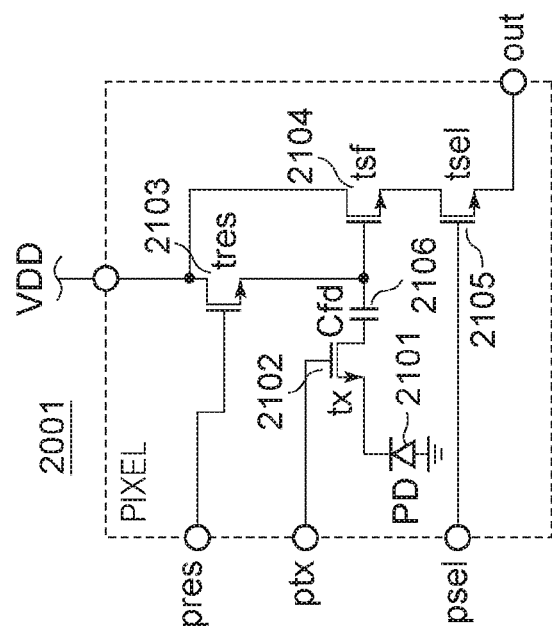
Figure 4A:
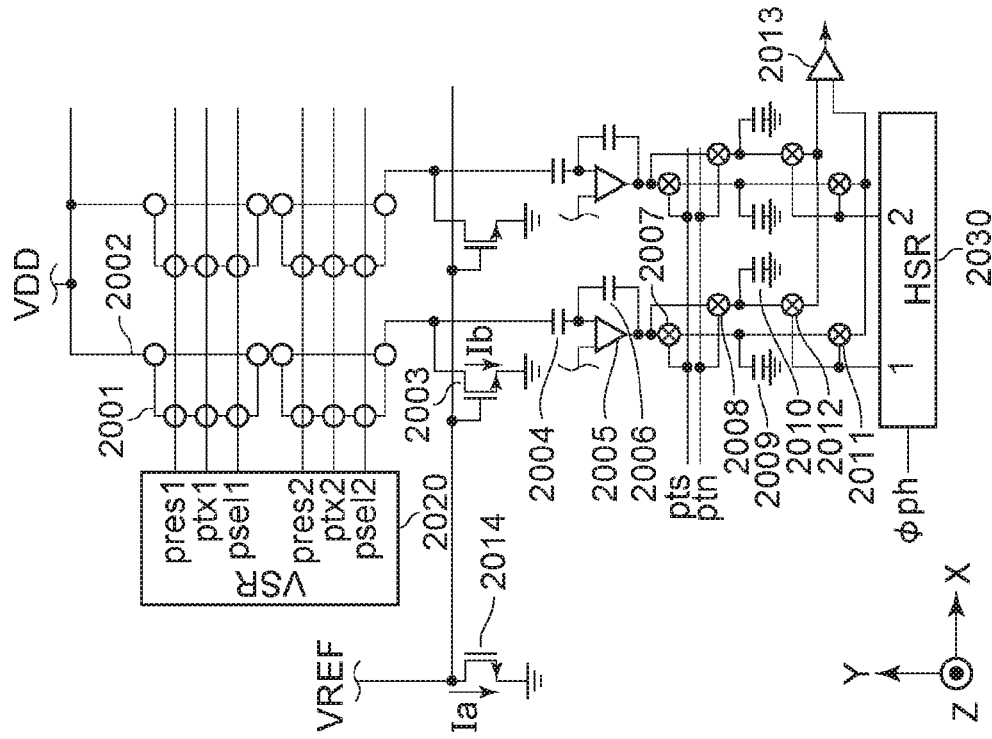
FIG. 4A and FIG. 4B are schematic diagrams for describing the imaging apparatus according to the embodiment of the present disclosure.
Figure 4B:
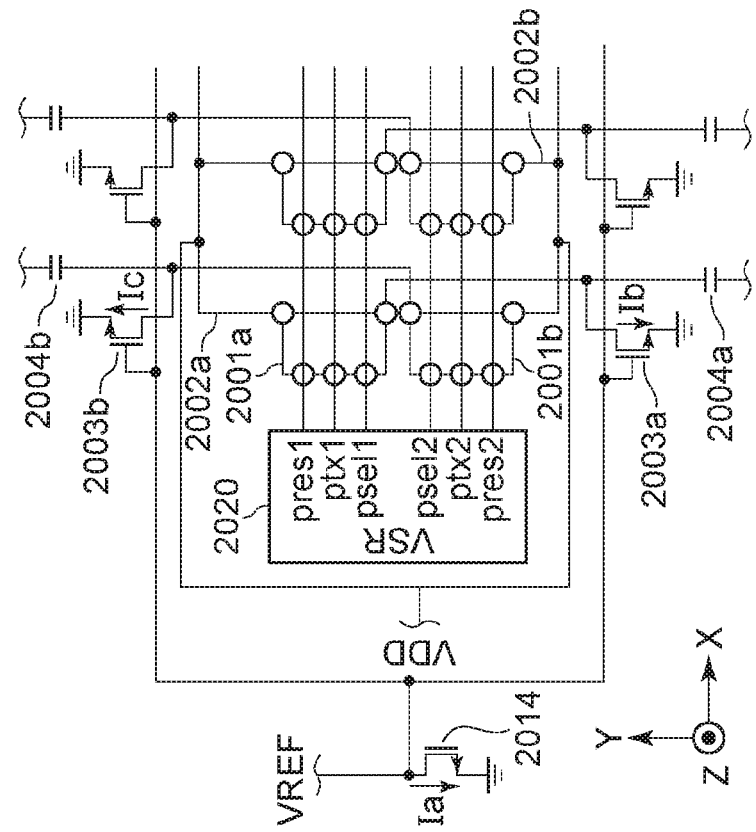

The terminal out illustrated in FIG. 3A is connected to the signal output line 2002 illustrated in FIG. 3B. The amplifier transistor 2104 is connected to a current source load transistor 2003 in the current source so as to compose a source follower circuit using the signal output line 2002 via the selection transistor 2105. For example, a MOS transistor is used as the current source load transistor 2003. As illustrated in FIG. 4B, the signal pres, the signal ptx, and the signal psel are supplied from a vertical scanning circuit (VSR) 2020 to each pixel 2001 for each row and the image signal is read from each pixel row. Each image signal is supplied to a capacitor 2004 in a column circuit via the signal output line 2002 to which the current source load transistor 2003 is connected. An operational amplifier 2005 composes an inverting amplifier with a feedback capacitor 2006 and the capacitor 2004. Both ends of the feedback capacitor 2006 are short-circuited with an analog switch (not illustrated) to reset the capacitor 2004 and the feedback capacitor 2006 and to reset downstream holding capacitance (cts) 2009 and holding capacitance (ctn) 2010.

The output from the operational amplifier 2005 is held in the holding capacitance (cts) 2009 and the holding capacitance (ctn) 2010 via analog switches 2007 and 2008 driving with control pulse pts and ptn, respectively. A signal immediately after the resetting of the floating diffusion 2106 in the pixel 2001 is cleared may be held in the holding capacitance (ctn) 2010. Then, a signal immediately after the signal from the photo diode 2101 is transferred to the floating diffusion 2106 may be held in the holding capacitance (cts) 2009. The signal held in the holding capacitance (ctn) 2010 is referred to as an image noise signal, and the signal held in the holding capacitance (cts) 2009 is referred to as an image signal. The image noise signal is used to generate an image in which characteristic variation of each pixel 2001 is suppressed as a reference signal of each pixel 2001. In other words, in reading out of the pixel signal corresponding to one row, the image noise signal and the image signal of each pixel 2001 are read out.

When the pixel signal corresponding to one row is held in the holding capacitance (cts) 2009 and the holding capacitance (ctn) 2010 for each column, pulses are sequentially driven with a signal φph input into a horizontal scanning circuit (HSR) 2030 to sequentially open and close analog switches 2011 and 2012 for each column. Sequentially opening and closing the analog switches 2011 and 2012 for each column causes the signals held in the holding capacitance (cts) 2009 and the holding capacitance (ctn) 2010 to be input into a downstream differential readout amplifier 2013 for each column and, then, to be externally output.

As illustrated in FIG. 4A, the terminal out of a pixel 2001a of the first row is connected to a signal output line 2002a. The amplifier transistor 2104 in the pixel 2001a is connected to a current source load transistor 2003a in the current source so as to compose a source follower circuit using the signal output line 2002a. The terminal out of a pixel 2001b of the second row is connected to a signal output line 2002b and the amplifier transistor 2104 in the pixel 2001b is connected to a current source load transistor 2003b in the current source so as to compose a source follower circuit using the signal output line 2002b. The image signals are supplied to capacitor 2004a and 2004b in the column circuit through the signal output lines 2002a and 2002b to which the current source load transistors 2003a and 2003b are connected, respectively. The current source group may be divided into two: an upper group and a lower group with the pixel 2001 sandwiched therebetween in the manner described above. For example, the respective current source groups may be provided for the pixels of odd-number rows and the pixels of even-number rows.

Figure 5:
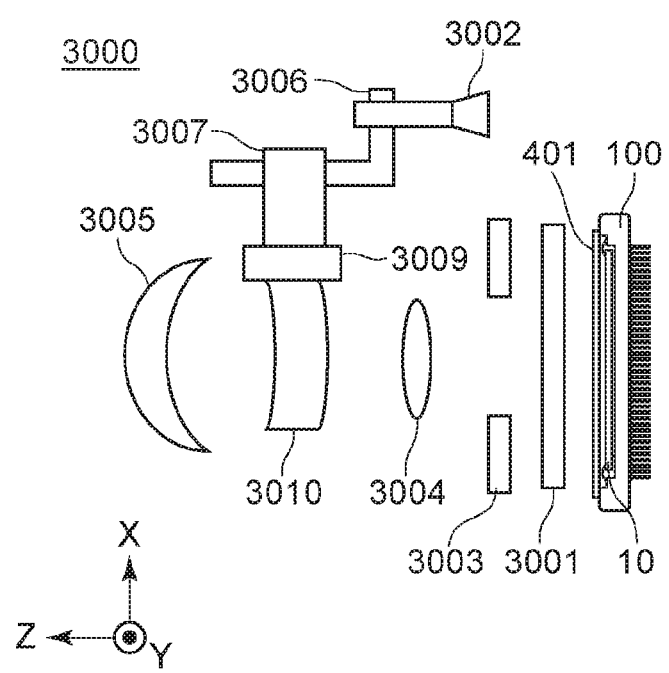
FIG. 5 is a schematic diagram for describing a camera in which the imaging apparatus according to the embodiment of the present disclosure is installed.

FIG. 5 is a block diagram illustrating an example of the configuration of a camera 3000 in which the imaging apparatus 100 according to the embodiment of the present disclosure is installed. A focal plane shutter 3001 for exposure of the chip 10 is arranged in front of the outer surface 401 of the light transmitting member 40 of the imaging apparatus 100. An aperture 3003, a photographing lens A 3004, a focus lens 3010, and a photographing lens B 3005 are arranged in front of the focal plane shutter 3001. In addition to these components, the camera 3000 may include a correcting lens actuator that moves a correcting lens for hand shake correction (image stabilization) in the lenses. A holding frame 3009 for holding the focus lens 3010 is fit into the focus lens 3010 by insertion. The focus lens 3010 is moved by a focus lens actuator including a stepping motor. A focus key 3006 that directly propagates the rotation of an ultrasonic motor 3002, which is known as the stepping motor, is inserted into a focusing block 3007 mounted to the holding frame 3009 with screws or the likes. The camera 3000 may include a chip actuator that moves the chip 10 for the hand shake correction (image stabilization) in the body of the camera 3000. The actuator (not illustrated) that moves the chip 10 may move the imaging apparatus 100.

In particular, in continuous photographing with the camera 3000, the vibration involved in an operation of a mechanical apparatus occurs while the image signal subjected the photoelectric conversion in the pixel 2001 in the chip 10 is being read out after the exposure in the chip 10 is finished. The operation of the mechanical apparatus may be, for example, an operation of a motor that actuates the focal plane shutter 3001, the focus lens 3010, the lens actuators, and the chip actuator.

The influence of the vibration on the image signal of the chip 10 will now be described.

The transistor 2014 FIG. 4A and FIG. 4B and the current source load transistor 2003 in the current source in FIG. 3B in the chip 10 are, for example, N-channel metal oxide semiconductor (NMOS) transistors. As illustrated in FIG. 3B, the current source load transistor 2003 is connected to a transistor 2014 connected to a voltage source (VREF) so as to compose a current mirror circuit. The transistor 2014 connected to the voltage source (VREF) is an NMOS transistor when the current source load transistor 2003 is the NMOS transistor. The current source load transistor 2003 has substantially the same characteristics as those of the transistor 2014 connected to the voltage source (VREF) and, thus, current Ia flowing through the voltage source (VREF) has the same magnitude as that of current Ib flowing through the current source load transistor 2003. When the current source is divided into two, as illustrated in FIG. 4A, each of the current source load transistors 2003a and 2003b is connected to the transistor 2014 connected to the voltage source (VREF) so as to compose a current mirror circuit. Accordingly, the current Ia flowing through the voltage source (VREF) has the same magnitude as those of the current Ib and current Ic flowing through the current source load transistors 2003a and 2003b, respectively.

The stress applied to the transistor is correlated with on-state current. This phenomenon is caused because the mobility of the electric charge is increased to increase the on-state current of the transistor when positive stress is applied while the mobility of the electric charge is decreased to decrease the on-state current of the transistor when negative stress is applied. For example, the on-state current is 0.62 mA/μm at a stress of −1,000 MPa, the on-state current is 0.65 mA/μm at a stress of 0 MPa, and the on-state current is 0.68 mA/μm at a stress of +1,000 MPa.

FIG. 3B is a diagram illustrating the relationship between the pixel signal and the on-state current using part of FIG. 4A and part of FIG. 4B, which are extracted for description of the relationship between the on-state current and the pixel signal.

When the positive stress is applied only to one of the amplifier transistor 2104 and the current source load transistor 2003, the characteristics of the on-state current of the transistor 2014 connected to the voltage source (VREF) may differ from the characteristics of the on-state current of the current source load transistor 2003. For example, when the positive stress is applied only to the current source load transistor 2003, the current Ib flowing through the current source load transistor 2003 is larger than the current Ia flowing through the transistor 2014 connected to the voltage source (VREF). When the current Ib flowing through the current source load transistor 2003 is increased, gate-source voltage Vgs is increased in the amplifier transistor 2104 connected to the current source load transistor 2003 so as to compose a source follower circuit. As a result, the pixel signal input into the capacitor 2004 in the column circuit may be smaller than that when the positive stress is not applied to the current source load transistor 2003. Conversely, when the negative stress is applied only to the current source load transistor 2003, the pixel signal input into the capacitor 2004 in the column circuit may be greater than that when the negative stress is not applied to the current source load transistor 2003. The above phenomenon occurs also in the current source load transistors 2003a and 2003b when the current source is divided into two, illustrated in FIG. 4A.

In contrast, when the positive stress is applied only to the amplifier transistor 2104, the current Ib flowing through the amplifier transistor 2104 is increased. In this case, the gate-source voltage Vgs is decreased and the pixel signal input into the capacitor 2004 in the column circuit may be greater than that when the positive stress is not applied to the amplifier transistor 2104. Conversely, when the negative stress is applied only to the amplifier transistor 2104, the pixel signal input into the capacitor 2004 in the column circuit may be smaller than that when the negative stress is not applied to the amplifier transistor 2104.

As described above, in reading out of the pixel signal corresponding to one row, the image noise signal and the image signal of each pixel 2001 are read out. The image noise signal is used to generate an image in which the characteristic variation of each pixel is suppressed as the reference signal of each pixel. The image signal is composed of the image noise signal and the image signal in the above manner. Here, the image signal when the timing of the vibration involved in an operation of the mechanical apparatus in the camera 3000 does not coincide with the timings when the image noise signal and the image signal are read out is referred to as a "without-vibration image signal." The image signal when the timing of the vibration involved in an operation of the mechanical apparatus in the camera 3000 coincides with the timings when the image noise signal and the image signal are read out is referred to as a "with-vibration image signal." As the difference between the with-vibration image signal and the without-vibration image signal is increased, the noise superimposed on the image signal that is output is not more negligible.

In other words, the stress is applied to the chip 10 due to the vibration involved in an operation of the mechanical apparatus in the camera 3000 and the stress exerts influence on the image signal. In addition, even when the current source load transistor 2003 and the amplifier transistor 2104 are P-channel metal oxide semiconductor (PMOS) transistors or bipolar transistors, the vibration involved in an operation of the mechanical apparatus in the camera 3000 exerts influence on the image signal. Accordingly, the current source load transistor 2003 and the amplifier transistor 2104 may be the PMOS transistors or the bipolar transistors.

The imaging apparatus 100 of the present embodiment is capable of suppressing the influence of the vibration occurring in the mechanical apparatus on the image signal subjected to the photoelectric conversion when the chip 10 is installed in the camera 3000 including the mechanical apparatus that may cause the vibration.

FIG. 6A schematically illustrates an image output from the camera 3000 in a state in which the vibration involved in an operation of the mechanical apparatus in the camera 3000 is caused. This image is photographed in the dark and any pattern excluding noise components does not exist. An image of 4,800 vertical pixels×6,000 horizontal pixels (A=4,800 and B=6,000) is photographed with the camera 3000, as illustrated by solid lines in FIG. 6A. This image is divided into multiple areas so that one area is composed by 500 horizontal pixels and 1,600 vertical pixels and the pixel value in each area is digitized using wavelet transform. At this time, Mexican hat wavelet is used as mother wavelet and the scale parameter is set to 10 as the wavelet transform data. The maximum value in the values resulting from the digitization using the wavelet transform in each area is used as the magnitude of the noise in each area. The noise in each area is increased as the value resulting from the digitization using the wavelet transform is increased.

The values of the digitized noises in the respective areas of the image illustrated in FIG. 6A are illustrated in a table in FIG. 6B. In the present embodiment, an area 4 had the maximum value of the digitized noise. The maximum value, among the values of the noises digitized using the wavelet transform in the respective areas in the above manner, is used as the value of the noise in the image in the dark illustrated in FIG. 6A.

Figure 7A:
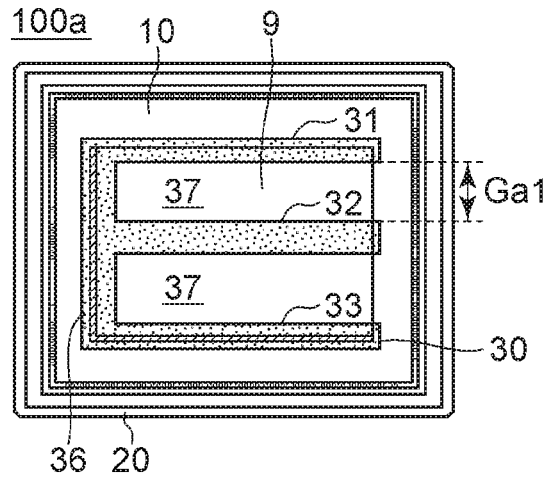
FIG. 7A to FIG. 7C are schematic diagrams for describing imaging apparatuses.
Figure 7B:
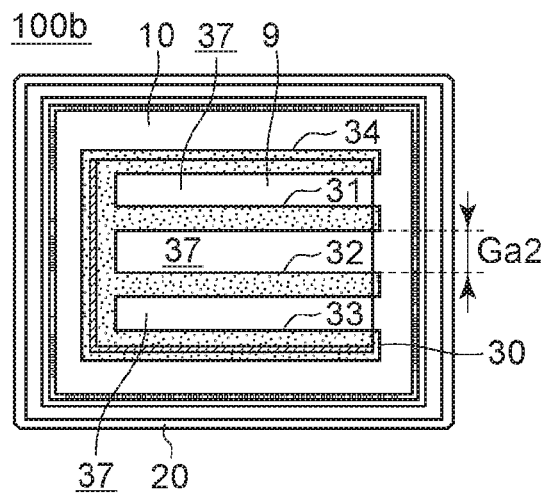
Figure 7C:
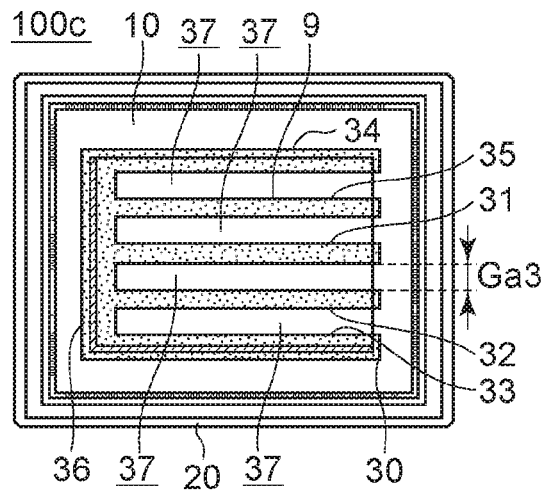

FIG. 7A, FIG. 7B, and FIG. 7C illustrate imaging apparatus 100a, 100b, and 100c, respectively, when the same chip 10 is bonded to the same base body 20 with the same adhesive 30 in three kinds of bonding patterns.

In the imaging apparatus 100a illustrated in FIG. 7A, the adhesive 30 includes the first portion 31, the second portion 32, and the third portion 33, which are placed between the base body 20 and the chip 10. The second portion 32 is positioned between the first portion 31 and the third portion 33 in the direction in which the pixel rows are arrayed. The gap 37 is provided between the first portion 31 and the second portion 32 and between the second portion 32 and the third portion 33. The second portion 32 is positioned between the effective pixel area 9 and the base body 20. A spacing of the adhesive 30 between the first portion 31 and the second portion 32 is denoted by Ga1. This bonding pattern is referred to as a pattern A.

In the imaging apparatus 100b illustrated in FIG. 7B, the adhesive 30 includes the first portion 31, the second portion 32, the third portion 33, and the fourth portion 34, which are placed between the base body 20 and the chip 10. The first portion 31 and the second portion 32 are positioned between the third portion 33 and the fourth portion 34 in the direction in which the pixel rows are arrayed. The gap 37 is provided between the first portion 31 and the second portion 32, between the second portion 32 and the third portion 33, and between the first portion 31 and the fourth portion 34. The first portion 31 and the second portion 32 are positioned between the effective pixel area 9 and the base body 20. A spacing of the adhesive 30 between the first portion 31 and the second portion 32 is denoted by Ga2. This bonding pattern is referred to as a pattern B.

In the imaging apparatus 100c illustrated in FIG. 7C, the adhesive 30 includes the first portion 31, the second portion 32, the third portion 33, the fourth portion 34, and a fifth portion 35, which are placed between the base body 20 and the chip 10. The first portion 31, the second portion 32, and the fifth portion 35 are positioned between the third portion 33 and the fourth portion 34 and the fifth portion 35 is positioned between the first portion 31 and the fourth portion 34 in the direction in which the pixel rows are arrayed. The second portion 32 is positioned between the first portion 31 and the third portion 33 and the first portion 31 is positioned between the fifth portion 35 and the second portion 32 in the direction in which the pixel rows are arrayed. The gap 37 is provided between the first portion 31 and the second portion 32, between the second portion 32 and the third portion 33, between the first portion 31 and the fifth portion 35, and between the fifth portion 35 and the fourth portion 34. The first portion 31, the second portion 32, and the fifth portion 35 are positioned between the effective pixel area 9 and the base body 20. A spacing of the adhesive 30 between the first portion 31 and the second portion 32 is denoted by Ga3. This bonding pattern is referred to as a pattern C.

Figure 8:
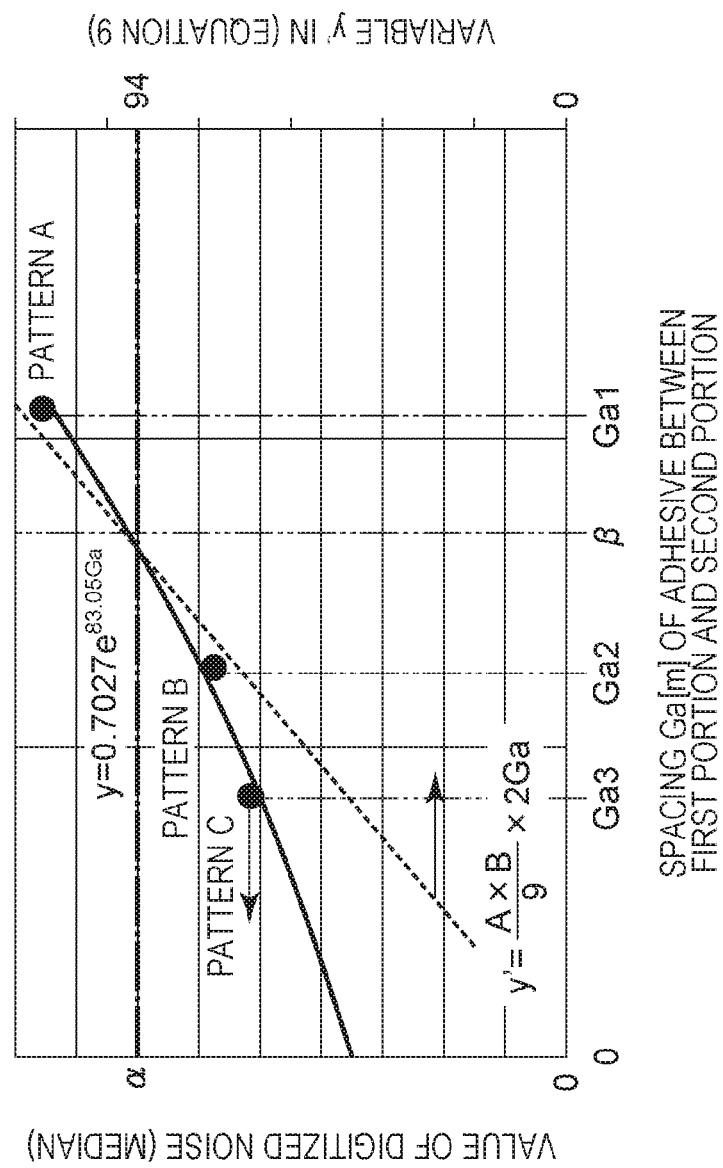
FIG. 8 is a graph for describing evaluation of the imaging apparatuses.

FIG. 8 is a graph indicating a result of evaluation of the imaging apparatuses. In this evaluation, the imaging apparatuses bonded in the three kinds of bonding patterns illustrated in FIG. 7A to FIG. 7C were installed in the camera 3000 illustrated in FIG. 5 and five samples were prepared for each of the imaging apparatuses bonded in the three kinds of bonding patterns. Then, 100 images in the dark were photographed in three kinds×five samples=15 samples. Referring to FIG. 8, the left vertical axis represents the median of each kind of the digitized noises in the images in the dark output from the camera 3000 and the horizontal axis represents the spacing Ga (m) of the adhesive 30 between the first portion 31 and the second portion 32 in each kind.

The bonding patterns having the medians of the digitized noises in the images in the dark output from the camera 3000, which are not greater than a, were the pattern B in FIG. 7B and the pattern C in FIG. 7C. Here, a is a permitted critical value of the median of the digitized nose in the camera 3000 of the present embodiment.

When the value (the median) of the digitized noise in each bonding pattern is represented by y (the vertical axis), as illustrated in FIG. 8, the spacing Ga (m) of the adhesive 30 between the first portion 31 and the second portion 32 is approximated by Equation (1):

$$y = 0.7027 \times e^{83.05 Ga} \tag{1}$$

Equation (1) is represented by a solid line in the graph in FIG. 8. Since the median y of the noise is decreased as the spacing Ga (m) of the adhesive 30 between first portion 31 and the second portion 32 is decreased, the image signal of the chip 10 is less influenced when the spacing Ga (m) of the adhesive 30 between first portion 31 and the second portion 32 is decreased. This is because a natural frequency f (Hz) of the chip 10 is increased in the range of the gap 37 provided between the first portion 31 and the second portion 32.

When a maximum image-signal read-out count F (Hz) of the chip 10 per one second is increased, the timing of occurrence of the vibration involved in an operation of the mechanical apparatus in the camera 3000 is likely to coincide with the image-signal read-out timing and the image signal of the chip 10 is likely to be influenced.

Accordingly, a relational expression is derived which causes the image signal of the chip 10 to be less influenced in the relationship between the natural frequency f (Hz) of the chip 10 and the maximum image-signal read-out count F (Hz) of the chip 10 per one second.

The natural frequency f (Hz) of the chip 10 is represented by Equation (2) where the spacing of the adhesive 30 between the first portion 31 and the second portion 32 is denoted by Ga (m), the Young modulus of the chip 10 is denoted by E (N/m$^2$), and the density of the chip 10 is denoted by ρ (kg/m$^3$).

$$f = \frac{\lambda}{2\pi Ga} \times \sqrt{\frac{E}{\rho}} \tag{2}$$

In Equation (2), λ is a dimensionless constant defined by the boundary condition and the vibration mode and λ=π in the primary mode when the boundary condition is fixing of both ends, as in the present embodiment. Only the primary mode in the minimum unit is described here. In addition, since the chip 10 is made of silicon, E=190,000 (N/m$^2$) and ρ=2,330 (kg/m$^3$). Accordingly, Equation (2) is represented by Equation (3):

$$f = \frac{9}{2Ga} \tag{3}$$

In order to read out only one image composed of the pixels of the C×A-number, in one embodiment, the image signal A-number of times for each pixel row is to be read out (or each pixel column). Furthermore, the image signal A×B-number of times is to be read out in order to read out only B-number images composed of the pixels of the C×A-number for one second. The maximum image-signal read-out count F (Hz) of the chip 10 per one second in the present embodiment is approximated by Equation (4):

$$F = A \times B \qquad (4)$$

The maximum image-signal read-out count F (Hz) of the chip 10 per one second is proportional (f∝F) to the natural frequency f (Hz) of the chip 10. The relationship with the spacing Ga (m) of the adhesive 30 between the first portion 31 and the second portion 32 is represented by Equation (5) according to Equation (3) and Equation (4):

$$y' \times \frac{9}{2Ga} = A \times B \qquad (5)$$

Here, y' is a variable. Modification of Equation (5) into a form of y'=results in Equation (6):

$$y' \times \frac{A \times B}{9} = \times 2Ga \qquad (6)$$

Assigning Equation (6) to FIG. 8 results in a dotted line in FIG. 8 where the spacing Ga (m) of the adhesive 30 between the first portion 31 and the second portion 32 is represented by the horizontal axis and the variable y' is represented by the right vertical axis.

The spacing Ga (m) of the adhesive 30 between the first portion 31 and the second portion 32 in Equation (1) at the permitted maximum value α at the median of the digitized noise is β (m) and Equation (6) at this time is y'=94. In other words, the maximum value of y' is 94 and the influence of the vibration involved in an operation of the mechanical apparatus in the camera 3000 on the image signal of the chip 10 is capable of being decreased in a range of y'≤94.

Consequently, the imaging apparatus capable of reducing the influence of the vibration on the image signal of the chip 10 is an imaging apparatus in which the spacing Ga (m) of the adhesive 30 between the first portion 31 and the second portion 32 has a value not higher than 423/(A×B) from Equation (6) and y'=94 (an imaging apparatus meeting Ga≤423/(A×B)). In order to reduce the influence of the vibration, the spacing Ga (m) of the adhesive 30 can meet Ga≤255/(A×B). In order to further reduce the influence of the vibration, the spacing Ga (m) of the adhesive 30 can meet Ga≤132/(A×B). If the spacing Ga (m) is made too small, the width of the adhesive 30 is increased, the fixed area between the chip 10 and the base body 20 is increased, and the stress between the chip 10 and the base body 20 is increased to possibly cause a problem other than the influence of the vibration. The spacing Ga (m) can meet Ga>90/(A×B). Setting the spacing Ga (m) of the adhesive 30 to a value meeting Ga>90/(A×B) enables the stress between the chip 10 and the base body 20 to be reduced.

Examples when A=3,600 and B=20 will now be described. When Ga≤423/(A×B), Ga≤5.8×10⁻³ (m) and the spacing of the adhesive 30 can have a value not higher than 5.8 mm. When Ga≤255/(A×B), Ga≤3.5×10⁻³ (m) and the spacing of the adhesive 30 can have a value not higher than 3.5 mm. When Ga≤132/(A×B), Ga≤1.8×10⁻³ (m) and the spacing of the adhesive 30 can have a value not higher than 1.8 mm. When Ga>90/(A×B), Ga>1.25×10⁻³ (m) and the spacing of the adhesive 30 can have a value higher than 1.25 mm.

The adhesive 30 may include the first portion 31, the second portion 32, the third portion 33, and the fourth portion 34, which are placed between the base body 20 and the chip 10; the first portion 31 and the second portion 32 may be positioned between the third portion 33 and the fourth portion 34 in the direction in which the pixel columns are arrayed; the gap 37 may be provided between the first portion 31 and the second portion 32, between the second portion 32 and the third portion 33, and between the first portion 31 and the fourth portion 34; and the first portion 31 and the second portion 32 may be positioned between the effective pixel area 9 and the base body 20. Alternatively, the adhesive 30 may include the first portion 31, the second portion 32, the third portion 33, the fourth portion 34, and the fifth portion 35, which are placed between the base body 20 and the chip 10; the first portion 31, the second portion 32, and the fifth portion 35 may be positioned between the third portion 33 and the fourth portion 34, the fifth portion 35 may be positioned between the first portion 31 and the fourth portion 34, the second portion 32 may be positioned between the first portion 31 and the third portion 33, and the first portion 31 may be positioned between the fifth portion 35 and the second portion 32 in the direction in which the pixel rows are arrayed: the gap 37 may be provided between the first portion 31 and the second portion 32, between the second portion 32 and the third portion 33, between the first portion 31 and the fifth portion 35, and between the fifth portion 35 and the fourth portion 34; and the first portion 31, the second portion 32, and the fifth portion 35 may be positioned between the effective pixel area 9 and the base body 20.

The length of the gap 37 provided between the first portion 31 and the second portion 32 is greater than 1.5 (mm). Even if the gap 37 having a length of 1.5 (mm) or less is to be realized, the gap 37 that does not communicate with the space 38 facing side faces of the chip 10 is produced in the bonding of the chip 10 to the base body 20. When the gap 37 that does not communicate with the space 38 facing side faces of the chip 10 exists, the air in the gap 37 that does not communicate with the space 38 facing side faces of the chip 10 is heated and expanded with heat generated when the adhesive 30 is applied to the base body 20, the chip 10 is bonded to the base body 20, and the adhesive 30 is then hardened and, thus, the chip 10 is tilted. The photographing lens A 3004, the focus lens 3010, and the photographing lens B 3005 are provided in front of the chip 10, as illustrated in FIG. 5, and an image formed on the chip 10 is varied if the positional relationship between the chip 10 and the photographing lens A 3004, the focus lens 3010, and the photographing lens B 3005 is broken. Specifically, the length of the gap 37 is made greater than 1.5 (mm) in order to cause the gap 37 to communicate with the space 38 facing side faces of the chip 10.

When the spacing of the adhesive 30 between the first portion 31 and the second portion 32 in Equation (6) is 1.5 (mm), y'=20. Accordingly, the spacing Ga of the adhesive 30 between the first portion 31 and the second portion 32 is greater than 90/(A×B) according to Equation (6) and y'=20. In addition, the gap 37 that does not communicate with the space 38 facing side faces of the chip 10 is less likely to be formed by making the width of the first portion 31 and the width of the second portion 32 in the direction in which the pixel rows are arrayed in FIG. 1A smaller than the spacing Ga.

Figure 9A:
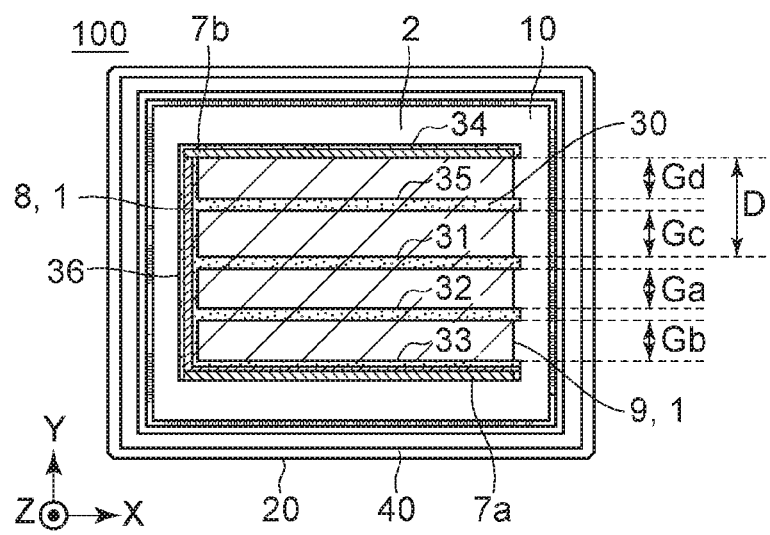
FIG. 9A to FIG. 9C are schematic diagrams for describing imaging apparatuses.

Also setting the spacing Gb (m) of the adhesive 30 between the second portion 32 and the third portion 33 in FIG. 1A corresponding to the pattern B and in FIG. 9A corresponding to the pattern C to a value meeting Gb≤423/(A×B) enables the influence of the vibration involved in an operation of the mechanical apparatus in the camera 3000 on the image signal of the chip 10 to be reduced.

The distance D of the adhesive 30 between the first portion 31 and the fourth portion 34 in FIG. 1A corresponding to the pattern B and in FIG. 9A corresponding to the pattern C is not greater than the length resulting from addition of the spacing Ga of the adhesive 30 between the first portion 31 and the second portion 32 and the spacing Gb of the adhesive 30 between the second portion 32 and the third portion 33.

Gc≤423/(A×B) is met also for the spacing Gc of the adhesive 30 between the first portion 31 and the fourth portion 34 in FIG. 1A corresponding to the pattern B and the spacing Gc of the adhesive 30 between the first portion 31 and the fifth portion 35 in FIG. 9A corresponding to the pattern C. Also setting a spacing Gd of the adhesive 30 between the fourth portion 34 and the fifth portion 35 in FIG. 9A corresponding to the pattern C to a value meeting Gd≤423/(A×B) enables the influence of the vibration involved in an operation of the mechanical apparatus in the camera 3000 on the image signal of the chip 10 to be reduced.

As illustrated in the enlarged detail view of the IC portion in FIG. 1C, the light shielded pixel area 8 is provided along the outer periphery of the pixel portion 1 of the chip 10. The light shielded pixels 1007, which are shielded by the light shielding layer 1003 illustrated in FIG. 2C to define the reference voltage in dark time, are provided in the light shielded pixel area 8. If air space exists immediately below the rear face 102 of the chip 10, instead of the adhesive 30, part of oblique light incident from the microlens layer 1001 above the effective pixels 1006 is reflected on the rear face 102 of the chip 10, as illustrated in FIG. 2C, to cause the photoelectric conversion in the photo diode 2101 in the adjacent pixel 2001. If the same phenomenon occurs also in the light shielded pixel area 8, the photoelectric conversion that is not intended is caused and the object of defining the reference voltage in dark time is not achieved.

Accordingly, positioning the black adhesive 30 between the light shielded pixel area 8 and the base body 20 causes the oblique light incident from the microlens layer 1001 above the effective pixels 1006 to be absorbed in the adhesive 30 to make the photoelectric conversion that is not intended less likely to occur.

As illustrated in FIG. 1A, the light shielded pixel area 8 is provided in the X direction (the row direction) and the Y direction (the column direction) outside the effective pixel area 9. Accordingly, providing the adhesive 30 for the sixth portion 36 positioned between the light shielded pixel area 8 provided in the Y direction (the column direction) and the base body 20 and providing the adhesive 30 for the third portion 33 positioned between the light shielded pixel area 8 provided in the X direction (the row direction) and the base body 20 can make the photoelectric conversion that is not intended less likely to occur in the light shielded pixel area 8.

As described above, the stress is applied to the current source load transistor 2003 due to the vibration involved in an operation of the mechanical apparatus in the camera 3000 and the stress exerts influence on the image signal. Accordingly, the adhesive 30 is provided between all the current sources each having the current source load transistor 2003 arranged therein and the base body 20.

The enlarged detail view of the IC portion in FIG. 1C results from addition of part of the detailed structure of the chip 10. The current source groups 7a and 7b each having the current source load transistor 2003 arranged therein are provided along the peripheries in the X direction (the row direction) of the pixel portion 1 of the chip 10, as illustrated in FIG. 1A and the enlarged detail view of the IC portion in FIG. 1C, and is generally provided in a narrow range of a width of 1 mm or less. Since the adhesive 30 is generally provided between the chip 10 and the base body 20 with a width of not smaller than 2 mm and not greater than 10 mm, the gap 37, which is the closed space, is not produced due to the provision of the adhesive 30 between all of the current source groups 7a and 7b and the base body 20. Accordingly, it is possible to provide the adhesive 30 between all the current source groups 7a and 7b and the base body 20 to reduce the influence of the vibration involved in an operation of the mechanical apparatus in the camera 3000 on the image signal.

The current sources in the current source groups 7a and 7b in FIG. 1A and FIG. 1C correspond to the current sources in which the current source load transistors 2003a and 2003b in FIG. 4A are arranged. Since the effective pixel area 9 is positioned between the current source group 7a and the current source group 7b, the adhesive 30 is provided in the third portion 33 positioned between in the current source group 7a and the base body 20 and the adhesive 30 is provided in the fourth portion 34 positioned between the current source group 7b and the base body 20. In addition, one current source group may be provided, as illustrated in FIG. 4B. In this case, providing the adhesive 30 between one current source group and the base body 20 enables the influence of the vibration involved in an operation of the mechanical apparatus in the camera 3000 on the image signal to be reduced.

Figure 9B:
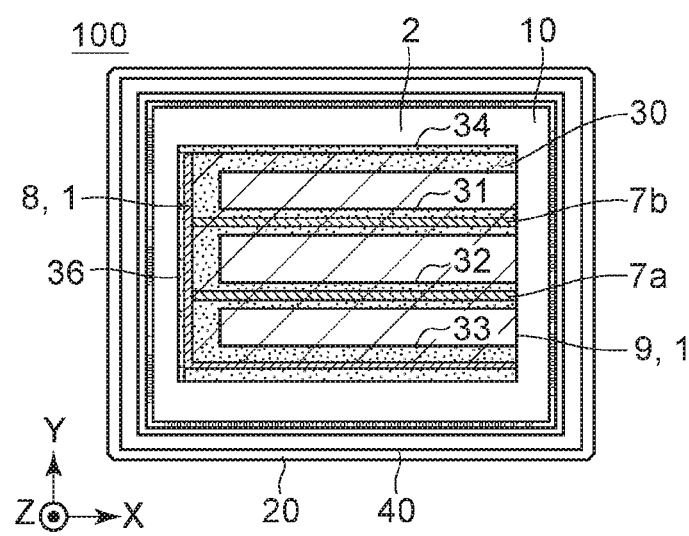

When the pixel portion 1 and the peripheral portion 2 are provided in separate chips and the chip 10 is produced by laminating the chips, the adhesive 30 is provided in the second portion 32 positioned between the current source group 7a and the base body 20 and the adhesive 30 is provided in the first portion 31 positioned between the current source group 7b and the base body 20, as illustrated in FIG. 9B.

As described above, the third portion 33 is positioned between the light shielded pixel area 8 and the base body 20 and is further positioned between the current source group 7a and the base body 20, and the fourth portion 34 is positioned between the current source group 7b and the base body 20. As illustrated in the enlarged detail view of the IC portion in FIG. 1C, the width of the light shielded pixel area 8 is generally 1.5 mm or less and the width of the current source group 7a is generally 1 mm or less. Since the distance between the light shielded pixel area 8 and the current source group 7a is generally 1 mm or less, the width of the third portion 33 is generally 3.5 mm or less. Since the adhesive 30 is capable of being provided between the chip 10 and the base body 20 with a width of not smaller than 2 mm and not greater than 10 mm, the gap 37, which is the closed space, is not produced due to the provision of the adhesive 30 in the third portion 33 positioned between the entire light shielded pixel area 8 and the base body 20 and between all the current sources in the current source group 7a and the base body 20. In addition, since the fourth portion 34 is positioned only between the current source group 7b and the base body 20, the width of the third portion 33 is greater than that of the fourth portion 34.

Since the amplifier transistor 2104 in the effective pixel area 9 to the base body 20 is to be bonded so as to be less influenced by the vibration involved in an operation of the mechanical apparatus in the camera 3000, the adhesive 30 is provided in the third portion 33 positioned between the first pixel row and the base body 20 and the adhesive 30 is provided in the fourth portion 34 positioned between an A-number-th pixel row and the base body 20. Here, A denotes the number of pixels in the pixel row in the effective pixel area 9.

Figure 9C:
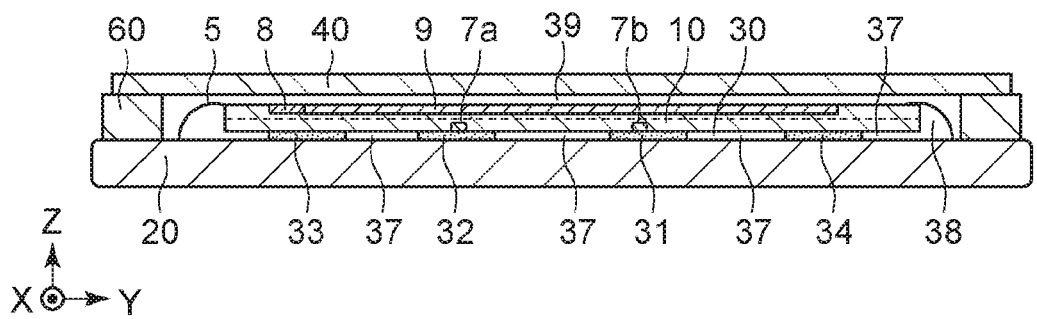

As illustrated in FIG. 9C, the recesses 21a and 21b may not be provided in the base body 20, a frame 60 may be provided around the base body 20, and the light transmitting member 40 may be fixed to the base body 20 with frame 60. The base body 20 may be a ceramic board or a printed board. The frame 60 may be made of resin or metal. The light transmitting member 40 may not be provided.

According to the present disclosure, the technology is capable of being provided, which is advantageous to reduction of the influence of the vibration on the image signal subjected to the photoelectric conversion. The embodiments described above may be appropriately modified within the sprit and the scope of the technology. The disclosed content of the present specification is not limited to the content described in the present specification and includes all the matters that are capable of being acquired from the present specification and the drawing appended to the present specification. In addition, the disclosed content of the present specification includes a complementary set of the concept described in the present specification. Specifically, if the present specification reads "A is B", the fact "A is not B" is disclosed in the present specification even if the description of "A is not B" is omitted. This is because it is assumed that the case of "A is not B" is considered when the present specification reads "A is B."

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-187965 filed on Oct. 11, 2019, which is hereby incorporated by reference herein in its entirety.

What is claimed is:

1. An apparatus comprising:
    a base body;
    a chip including a first face being a light incident face and a second face being opposed to the first face, that is placed on a third face of the base body so that the second face and the third face of the base body face each other and that is mainly made of silicon, and
    adhesive which is placed between the third face of the base body and the second face and with which the base body is bonded to the chip,
    wherein effective pixels of C×A-number composed of pixel rows of A-number and pixel columns of C-number or composed of the pixel rows of the C-number and the pixel columns of the A-number are arrayed in an effective pixel area of the chip, and images of a number not more than B-number, each of which is composed of the pixels of the C×A-number, are acquired from the chip for one second,
    wherein A, B and C are positive integers,
    wherein the adhesive includes a first portion, a second portion, a third portion, and a fourth portion, each of which having a longitudinal direction in a direction in which the pixel rows or the pixel columns are arrayed and placed between the base body and the chip; the first portion and the second portion are positioned between the third portion and the fourth portion in such a manner as not to intersect with the direction; a gap is provided between the first portion and the second portion, between the second portion and the third portion, and between the first portion and the fourth portion; and the first portion and the second portion are positioned between the effective pixel area and the base body, and
    wherein a first spacing of the adhesive between the first portion and the second portion is greater than a distance between the base body and the chip via the gap between the first portion and the second portion.

2. The apparatus according to claim 1,
wherein pixel signals of the effective pixels of the C×A-number are read out for every pixel row.

3. The apparatus according to claim 2,
wherein the first spacing of the adhesive meets $Ga \leq 423/(A \times B)$ where the first spacing is denoted by Ga.

4. The apparatus according to claim 1,
wherein the first spacing of the adhesive meets $Ga \leq 255/(A \times B)$ where the first spacing is denoted by Ga.

5. The apparatus according to claim 1,
wherein the first spacing of the adhesive meets $Ga \leq 132/(A \times B)$ where the first spacing is denoted by Ga.

6. The apparatus according to claim 1,
wherein a second spacing of the adhesive between the second portion and the third portion meets $Gb > 423/(A \times B)$ where the second spacing is denoted by Gb.

7. The apparatus according to claim 1,
wherein $D \leq Ga + Gb$ where the first spacing is denoted by Ga, a spacing of the adhesive between the second portion and the third portion is denoted by Gb, and a distance between the first portion and the fourth portion is denoted by D.

8. The apparatus according to claim 1,
wherein the adhesive includes a fifth portion positioned between the first portion and the fourth portion, a gap is provided between the fifth portion and the first portion and between the fourth portion and the fifth portion, and the first portion and the fifth portion are positioned between the effective pixel area and the base body.

9. The apparatus according to claim 8,
wherein a third spacing of the adhesive between the first portion and the fourth portion meets $Gc \leq 423/(A \times B)$ where the third spacing is denoted by Gc, and a fourth spacing of the adhesive between the fourth portion and the fifth portion meets $Gd \leq 423/(A \times B)$ where the fourth spacing is denoted by Gd.

10. The apparatus according to claim 1,
wherein a width of the first portion in the direction and a width of the second portion in the direction are smaller than the first spacing.

11. The apparatus according to claim 1,
wherein the chip has a first light shielded pixel area and the third portion is positioned between the first light shielded pixel area and the base body.

12. The apparatus according to claim 1,
wherein the adhesive extends along a direction, and the adhesive includes a sixth portion having a length exceeding $Ga + Gb + Gc$ in the direction, where the first spacing is denoted by Ga, a second spacing of the adhesive between the second portion and the third portion is denoted by Gb, and a third spacing of the adhesive between the first portion and the fourth portion is denoted by Gc.

13. The apparatus according to claim 12,
wherein the chip has a second light shielded pixel area and the sixth portion is positioned between the second light shielded pixel area and the base body.

14. The apparatus according to claim 1,
wherein the adhesive is positioned between all light shielded pixels of the chip and the base body.

15. The apparatus according to claim 1,
wherein the chip includes a plurality of current sources each corresponding to any of all the pixel columns and the adhesive is positioned between all the plurality of current sources and the base body.

16. The apparatus according to claim 2,
wherein the chip includes a plurality of current sources each corresponding to any of the pixel columns of the C-number, the plurality of current sources include a first current source group and a second current source group, the effective pixel area is positioned between the first current source group and the second current source group, the third portion is positioned between the first current source group and the base body, and the fourth portion is positioned between the second current source group and the base body.

17. The apparatus according to claim 2,
wherein the chip includes a plurality of current sources each corresponding to any of the pixel columns of the C-number, the plurality of current sources include a first current source group and a second current source group, the effective pixel area is positioned between the first current source group and the second current source group, the second portion is positioned between the first current source group and the base body, and the first portion is positioned between the second current source group and the base body.

18. The apparatus according to claim 2,
wherein the pixel rows of A-2-number are placed between a certain pixel row and another pixel row in the effective pixel area, the third portion is positioned between the certain pixel row and the base body, and the fourth portion is positioned between the other pixel row and the base body.

19. The apparatus according to claim 1,
wherein a width of the third portion in the direction is greater than a width of the fourth portion in the direction.

20. The apparatus according to claim 1,
wherein the gap between the first portion and the second portion communicates with a space facing side faces of the chip.

21. The apparatus according to claim 1,
wherein the first spacing of the adhesive meets Ga>90/(A×B) where the first spacing is denoted by Ga.

22. A camera comprising:
the apparatus according to claim 1; and
a mechanical apparatus that actuates at least one of an actuator that moves the chip, an actuator that moves a lens, and a focal plane shutter.

23. The apparatus according to claim 1, wherein the gap includes an air.

24. The apparatus according to claim 1,
wherein the base body includes a fourth face being opposed to the third face, and
wherein an external terminal is formed on the fourth face.

25. The apparatus according to claim 24,
wherein the external terminal is connected to an internal wiring in the base body, and
wherein a signal outputted from the chip is supplied to the external terminal.

* * * * *